US012628663B2

(12) United States Patent
Hayashi

(10) Patent No.: US 12,628,663 B2
(45) Date of Patent: May 12, 2026

(54) LEAD FRAME, METHOD OF MAKING LEAD FRAME, SEMICONDUCTOR APPARATUS, AND METHOD OF MAKING SEMICONDUCTOR APPARATUS

(71) Applicant: SHINKO ELECTRIC INDUSTRIES CO., LTD., Nagano (JP)

(72) Inventor: Shintaro Hayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 438 days.

(21) Appl. No.: 18/062,243

(22) Filed: Dec. 6, 2022

(65) Prior Publication Data

US 2023/0197580 A1     Jun. 22, 2023

(30) Foreign Application Priority Data

Dec. 22, 2021     (JP) ................................. 2021-208309

(51) Int. Cl.
*H10W 70/40* (2026.01)
*H10W 70/04* (2026.01)
(Continued)

(52) U.S. Cl.
CPC ....... *H10W 70/424* (2026.01); *H10W 70/042* (2026.01); *H10W 70/417* (2026.01);
(Continued)

(58) Field of Classification Search
CPC ........... H01L 23/49548; H01L 23/3107; H01L 23/49513; H01L 23/49582; H01L 23/3121;
(Continued)

(56) References Cited

U.S. PATENT DOCUMENTS 5,150,194 A  *  9/1992  Brooks ............. H01L 23/49541
                                                          257/667
6,927,096 B2 *  8/2005  Shimanuki ........ H01L 23/49548
                                                          438/113
(Continued)

FOREIGN PATENT DOCUMENTS

JP        2002-076172        3/2002
JP        2004-048063        2/2004
(Continued)

OTHER PUBLICATIONS

Office Action mailed on Jan. 28, 2025 with respect to the corresponding Japanese patent application No. 2021-208309.
(Continued)

*Primary Examiner* — Teresa M. Arroyo
(74) *Attorney, Agent, or Firm* — IPUSA, PLLC

(57) ABSTRACT

A lead frame including a die pad having a first surface and a second surface opposite the first surface, a lead having a third surface flush with the first surface and a fourth surface opposite the third surface, and a link portion connecting the die pad and the lead, wherein the link portion includes a first portion that surrounds the die pad between the die pad and the lead in a plan view, wherein the first portion has a fifth surface flush with the first surface and the third surface, and has a sixth surface opposite the fifth surface, wherein the second surface is closer to a plane containing the first surface, the third surface, and the fifth surface than is the fourth surface, and wherein the sixth surface is closer to the plane containing the first surface, the third surface, and the fifth surface than is the second surface.

3 Claims, 20 Drawing Sheets

(51) Int. Cl.
| | |
|---|---|
| *H10W 72/00* | (2026.01) |
| *H10W 72/30* | (2026.01) |
| *H10W 72/90* | (2026.01) |
| *H10W 74/01* | (2026.01) |
| *H10W 74/10* | (2026.01) |
| *H10W 90/00* | (2026.01) |

(52) U.S. Cl.
CPC ........ *H10W 74/014* (2026.01); *H10W 74/111* (2026.01); *H10W 72/073* (2026.01); *H10W 72/075* (2026.01); *H10W 72/352* (2026.01); *H10W 72/884* (2026.01); *H10W 72/952* (2026.01); *H10W 90/736* (2026.01); *H10W 90/756* (2026.01)

(58) Field of Classification Search
CPC ..... H01L 23/49565; H01L 2224/48091; H01L 2224/48245; H01L 2224/73265; H01L 2224/83447; H01L 2224/85439; H01L 2224/85444; H01L 2224/92247; H01L 2224/29139; H01L 2224/32245; H01L 21/4828; H01L 21/561; H01L 21/4832; H01L 21/4825; H01L 21/56; H01L 24/48; H01L 24/29; H01L 24/32; H01L 24/73; H01L 24/83; H01L 24/85; H01L 24/92
See application file for complete search history.

(56) References Cited

U.S. PATENT DOCUMENTS

| | | | | |
|---|---|---|---|---|
| 10,037,935 | B1 * | 7/2018 | Pang ................. | H01L 23/49503 |
| 2006/0189037 | A1 * | 8/2006 | Abbott ................... | H01L 24/97 |
| | | | | 438/123 |
| 2009/0294932 | A1 * | 12/2009 | Sahasrabudhe ... | H01L 23/49548 |
| | | | | 257/666 |
| 2015/0102476 | A1 * | 4/2015 | Zhu ................... | H01L 23/49524 |
| | | | | 257/676 |
| 2017/0040183 | A1 * | 2/2017 | Sakai ................. | H01L 23/4952 |
| 2019/0096788 | A1 * | 3/2019 | Rodriguez ........ | H01L 23/49541 |
| 2019/0198454 | A1 * | 6/2019 | Talledo ............. | H01L 23/49541 |
| 2020/0235042 | A1 * | 7/2020 | Bin Abdul Aziz | ......................... |
| | | | | H01L 23/49541 |
| 2022/0093494 | A1 * | 3/2022 | Huang ............... | H01L 23/3114 |

FOREIGN PATENT DOCUMENTS

| | | |
|---|---|---|
| JP | 2008-141222 | 6/2008 |
| JP | 2011-029335 | 2/2011 |
| JP | 2012-069886 | 4/2012 |
| JP | 2013-062527 | 4/2013 |
| JP | 2019-036631 | 3/2019 |
| TW | 201438173 | 10/2014 |

OTHER PUBLICATIONS

Office Action mailed on Jan. 30, 2026 with respect to the corresponding TW patent application No. 111148708.

* cited by examiner

IVb

IVb

10

10

161U

161U

161S

VIb        VIb

10

161Z

161U

161Z

LEAD FRAME, METHOD OF MAKING LEAD FRAME, SEMICONDUCTOR APPARATUS, AND METHOD OF MAKING SEMICONDUCTOR APPARATUS

CROSS-REFERENCE TO RELATED APPLICATIONS

The present application is based upon and claims the benefit of priority from the prior Japanese Patent Application No. 2021-208309 filed on Dec. 22, 2021, with the Japanese Patent Office, the entire contents of which are incorporated herein by reference.

FIELD

The present disclosures relate to lead frames, methods of making a lead frame, semiconductor apparatuses, and methods of making a semiconductor apparatus.

BACKGROUND

There is a demand for thin semiconductor apparatuses having a lead frame.

It is conceivable to reduce the thickness of a semiconductor apparatus by reducing the thickness of a lead frame. However, reducing the thickness of a lead frame likely causes the lead frame to be deformed at the time of mounting a semiconductor device or at the time of encapsulation with an encapsulation resin.

It is an object of the present disclosure to provide a lead frame, a method of manufacturing a lead frame, a semiconductor apparatus, and a method of manufacturing a semiconductor apparatus by which the thickness of the semiconductor apparatus is reduced while reducing deformation of the lead frame.

PRIOR ART DOCUMENT

[Patent Document]
  [Patent Document 1] Japanese Laid-Open Patent Publication No. 2012-69886
  [Patent Document 2] Japanese Laid-Open Patent Publication No. 2011-29335

SUMMARY

According to an embodiment of the present disclosure, a lead frame includes a die pad portion having a first surface and a second surface opposite to the first surface, a lead portion having both a third surface flush with the first surface and a fourth surface opposite to the third surface, and a link portion connecting the die pad portion and the lead portion together, wherein the link portion includes a first portion that surrounds the die pad portion between the die pad portion and the lead portion in a plan view, wherein the first portion has a fifth surface flush with both the first surface and the third surface, and has a sixth surface opposite to the fifth surface, wherein the second surface is closer to a plane containing the first surface, the third surface, and the fifth surface than is the fourth surface, and wherein the sixth surface is closer to the plane containing the first surface, the third surface, and the fifth surface than is the second surface.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 1 is a drawing illustrating an outline of a lead frame according to a first embodiment;

DESCRIPTION OF EMBODIMENTS

Figure 2:
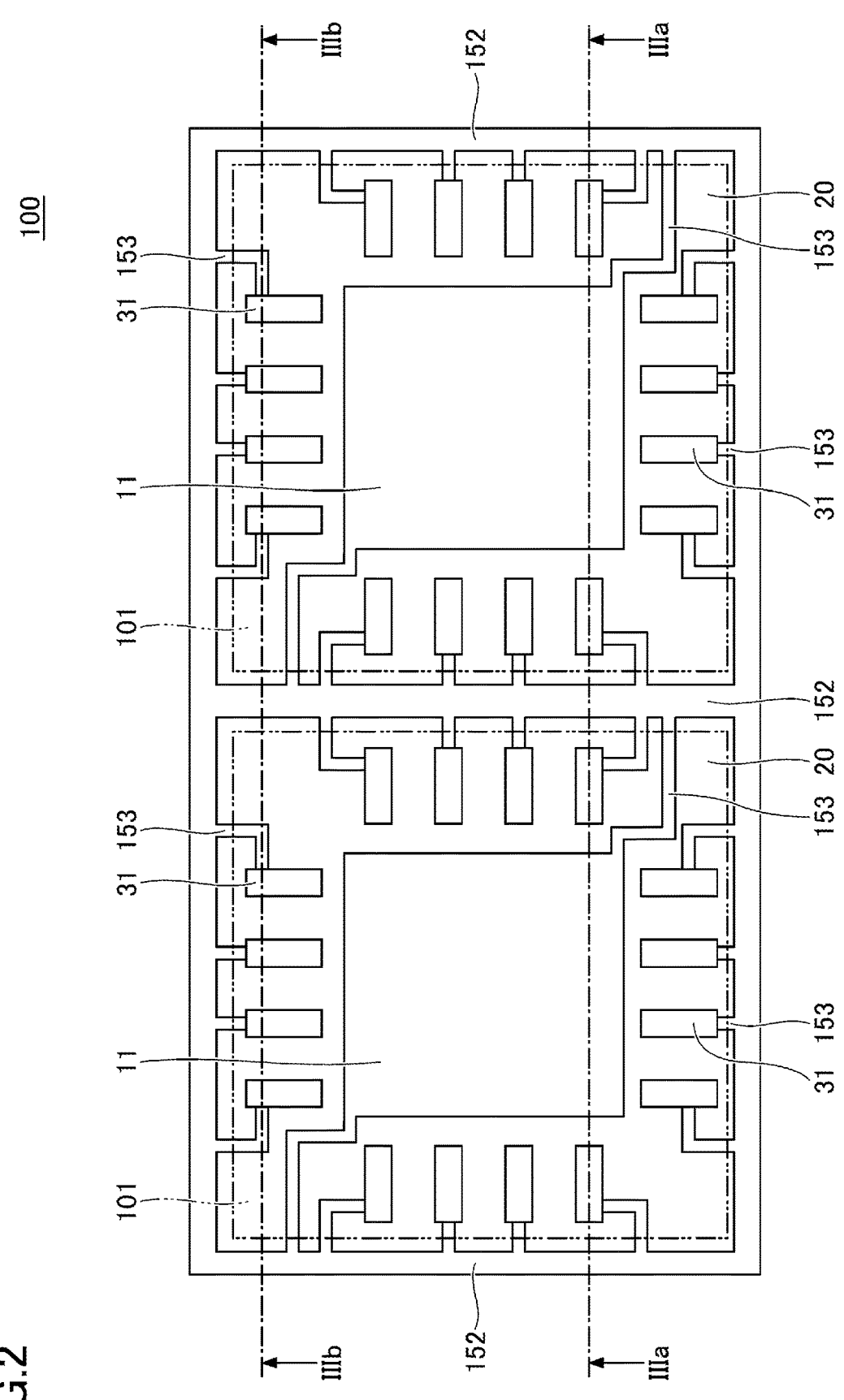
FIG. 2 is an enlarged top view of part of what is illustrated in FIG. 1.

In the following, embodiments will be described with reference to the accompanying drawings. It may be noted that, in the present specification and the drawings, elements having substantially the same functional configuration are denoted by the same reference numerals, and a duplicate description thereof may be omitted. In the description of embodiments, for convenience, the side of a lead frame on which a semiconductor device is mounted is referred to as an upper side, and the opposite side thereof is referred to as a lower side. A surface of the lead frame on which the semiconductor device is mounted is referred to as an upper surface, and a surface opposite thereto is referred to as a lower surface. However, the lead frame and the semiconductor apparatus may be used upside down or may be arranged at any angle. In addition, a plan view refers to a view of an object as viewed in the direction normal to the upper surface of the lead frame, and a plane shape refers to the shape of an object as viewed in the direction normal to the upper surface of the lead frame.

First Embodiment

In the following, a first embodiment will be described.
[Structure of Lead Frame]

Figure 1:
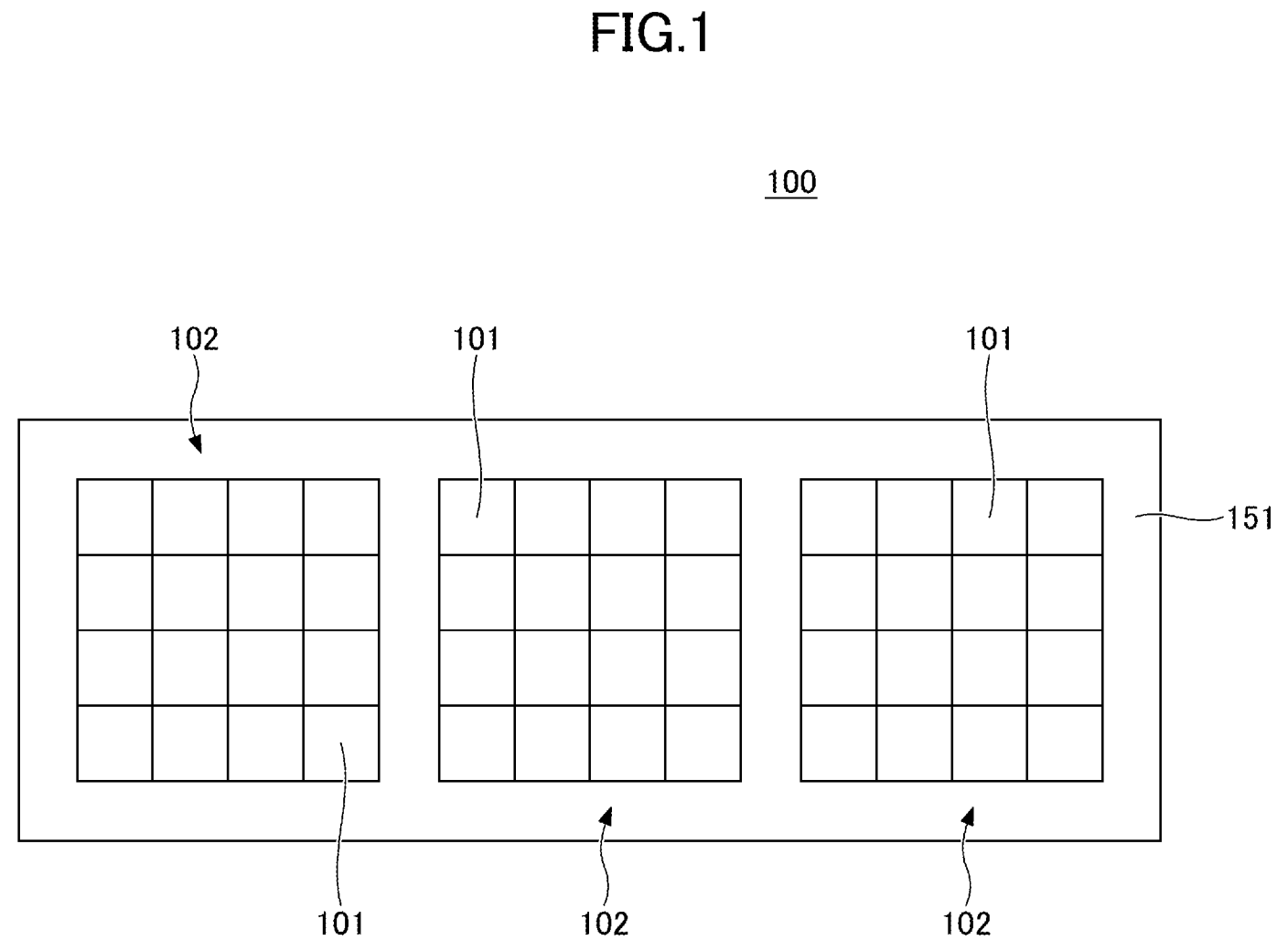
Figures 3A, 3B:
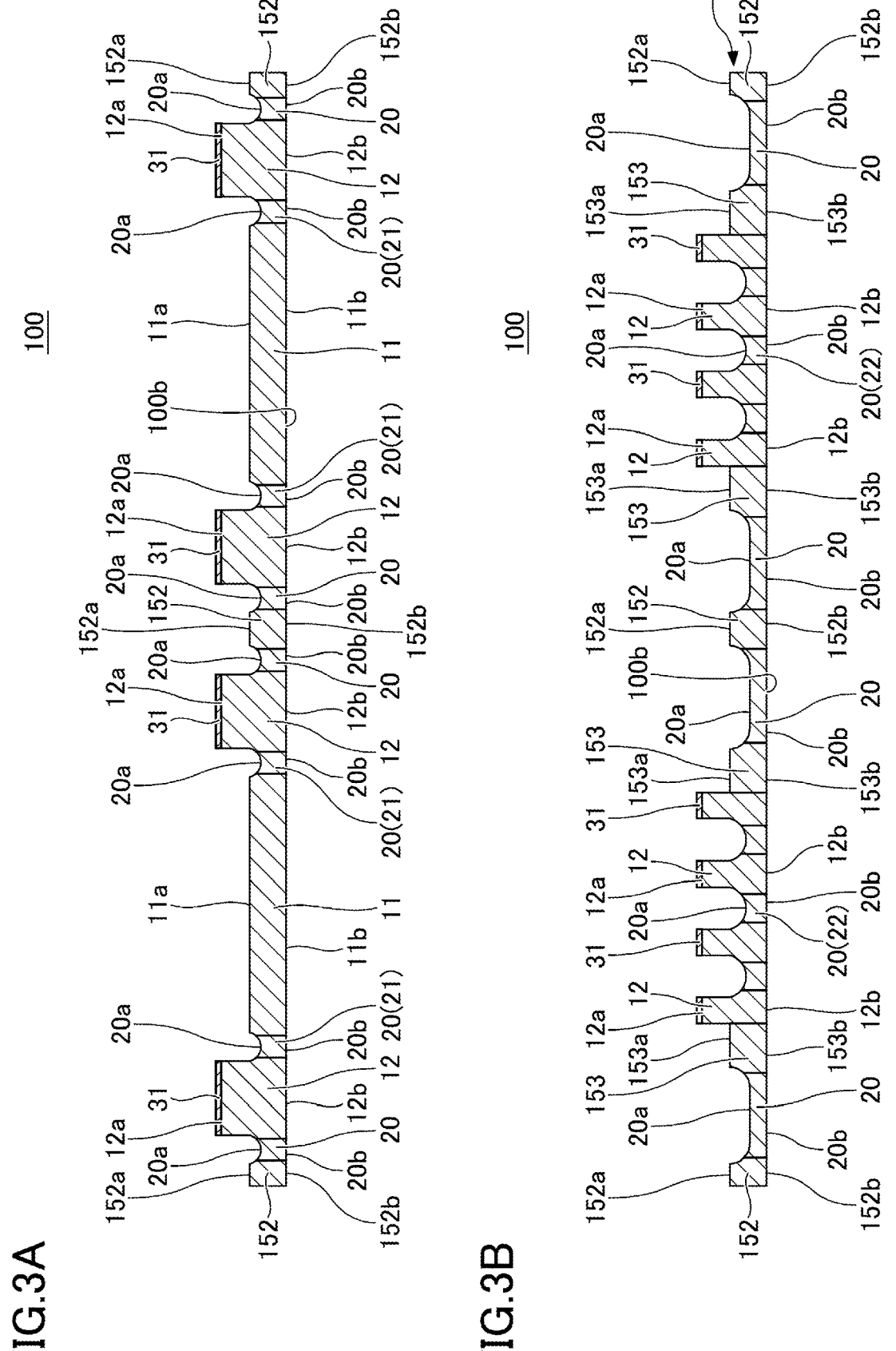
FIGS. 3A and 3B are cross-sectional views illustrating the lead frame according to the first embodiment.

The structure of a lead frame according to the first embodiment will be described. FIG. 1 is a drawing illustrating an outline of a lead frame according to the first embodiment. FIG. 2 is an enlarged top view of a portion of what is illustrated in FIG. 1. FIGS. 3A and 3B are cross-sectional views illustrating the lead frame according to the first embodiment. FIG. 3A corresponds to a cross-sectional view taken along the line IIIa-IIIa in FIG. 2. FIG. 3B corresponds to a cross-sectional view taken along the line IIIb-IIIb in FIG. 2.

A lead frame 100 according to the first embodiment has a semiconductor device mounted on the upper surface thereof, and is covered with an encapsulation resin to form a semiconductor apparatus. The lead frame 100 has a plurality of discrete separation areas 101. Each discrete separation area 101 has a rectangular plane shape, for example, and sixteen discrete separation areas 101 are arranged in four rows and four columns to form a discrete separation area group 102. The lead frame 100 includes, for example, three discrete separation area groups 102. The discrete separation area groups 102 are connected to each other via an outer frame 151. The outer frame 151 is provided around each of the discrete separation area groups 102, and includes a frame shape portion extending along the outer perimeter of the lead frame 100 and straight-line portions each extending between adjacent discrete separation area groups 102.

Each discrete separation area group 102 includes section bars 152 each extending between adjacent discrete separation areas 101. The section bars 152 are arranged like the lines of a chessboard in a plan view. The section bar is sometimes referred to as a dam bar.

Each of the discrete separation areas 101 includes a die pad portion 11, lead portions 12, and a plurality of plating lead portions 153 (which are also referred to as extending portions). The lead portions 12 are disposed around the die pad portion 11. Some of the plating lead portions 153 connect the section bars 152 and the lead portions 12 to each other, and the others connect the section bars 152 and the die pad portion 11 to each other.

The lead frame 100 includes link portions 20 provided in a region surrounded by the section bars 152. The link portions 20 connect the die pad portion 11, the lead portions 12, the section bars 152, and the plating lead portions 153 to each other. The link portions 20 include a first portion 21 and a second portion 22. The first portion 21 surrounds the die pad portion 11 between the die pad portion 11 and the plurality of lead portions 12 in the plan view. The second portion 22 is situated between two lead portions 12 adjacent to each other in the plan view.

The die pad portion 11 has an upper surface 11a (which is an example of a second surface) and a lower surface 11b (which is an example of a first surface) opposite from the upper surface 11a. Each lead portion 12 has an upper surface 12a (which is an example of a fourth surface) and a lower surface 12b (which is an example of a third surface) opposite from the upper surface 12a. Each section bar 152 has an upper surface 152a and a lower surface 152b opposite from the upper surface 152a. Each plating lead portion 153 has an upper surface 153a and a lower surface 153b opposite from the first surface 153a. Each link portion 20 has an upper surface 20a (which is an example of a sixth surface and an eighth surface) and a lower surface 20b (which is an example of a fifth surface and a seventh surface) opposite from the upper surface 20a.

The lower surface 11b of the die pad portion 11, the lower surfaces 12b of the lead portions 12, the lower surfaces 152b of the section bars 152, the lower surfaces 153b of the plating lead portions 153, and the lower surfaces 20b of the link portions 20 are flush with each other. The lower surface 11b of the die pad portion 11, the lower surfaces 12b of the lead portions 12, the lower surfaces 152b of the section bars 152, the lower surfaces 153b of the plating lead portions 153, and the lower surfaces 20b of the link portions 20 constitute the lower surface 100b of the lead frame 100.

The upper surface 11a of the die pad portion 11, the upper surfaces 12a of the lead portions 12, the upper surfaces 152a of the section bars 152, and the upper surfaces 153a of the plating lead portions 153 are parallel to the lower surface 100b of the lead frame 100. The upper surface 11a of the die pad portion 11, the upper surfaces 152a of the section bars 152, and the upper surfaces 153a of the plating lead portions 153 are located closer to the lower surface 100b of the lead frame 100 than are the upper surfaces 12a of the lead portions 12.

The upper surfaces 20a of the link portions 20 are closer to the lower surface 100b of the lead frame 100 than is the upper surface 11a of the die pad portion 11. The upper surface 20a of each link portion 20 may be a concave shape in a cross-sectional view taken in a direction parallel to the lower surface 100b of the lead frame 100, and may include a curved surface such as to bulge at a center thereof toward the lower surface 100b of the lead frame 100.

The lead frame 100 may further include a plating layer 31 provided on the upper surface 12a of each lead portion 12. The plating layer 31 includes, for example, a nickel layer, a palladium layer, and a gold layer stacked in this order from the upper surface 12a side of the lead portion 12. The plating layer 31 may include a silver layer.
[Method of Making Lead Frame]

In the following, a method of making the lead frame 100 according to the first embodiment will be described. FIGS. 4A and 4B through 12A and 12B are drawings illustrating the method of making the lead frame according to the first embodiment. FIGS. 4A, 5A, 6A, 7A, 8A, 9A, 10A, 11A, and 12A are top views, and FIGS. 4B, 5B, 6B, 7B, 8B, 9B, 10B, 11B, and 12B are cross-sectional views. FIGS. 6A and 6B through 12A and 12B illustrate one of the discrete separation areas 101.

Figure 4A:
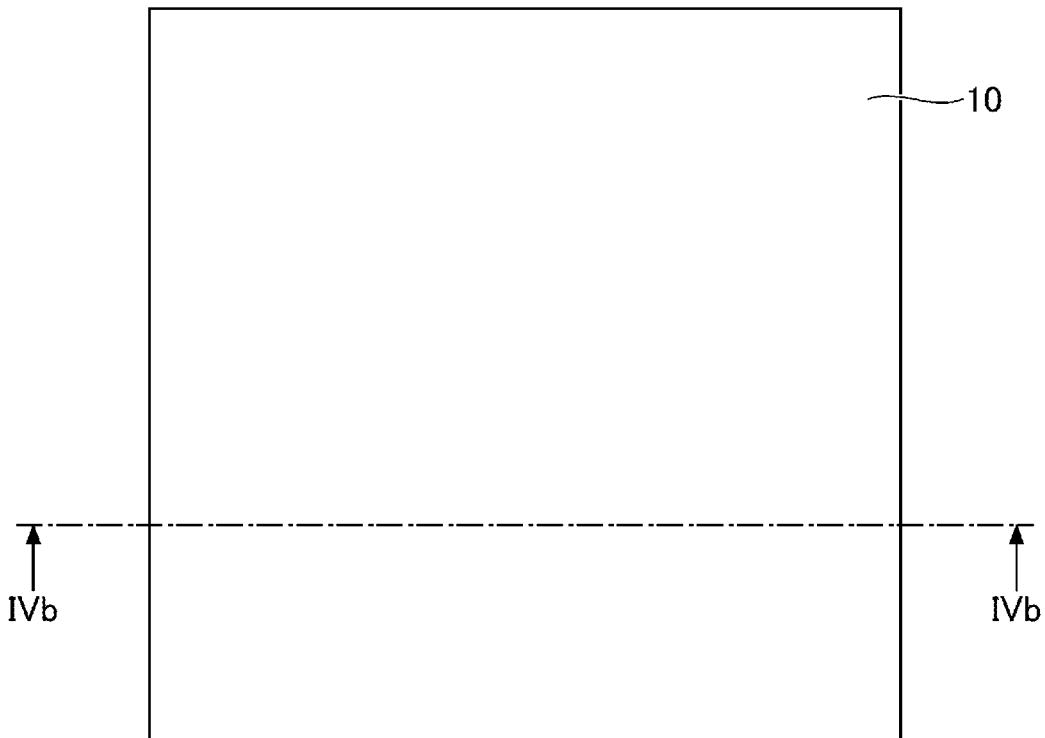
FIGS. 4A and 4B are drawings illustrating a method of making the lead frame according to the first embodiment.
Figure 4B:
Figure 5A:
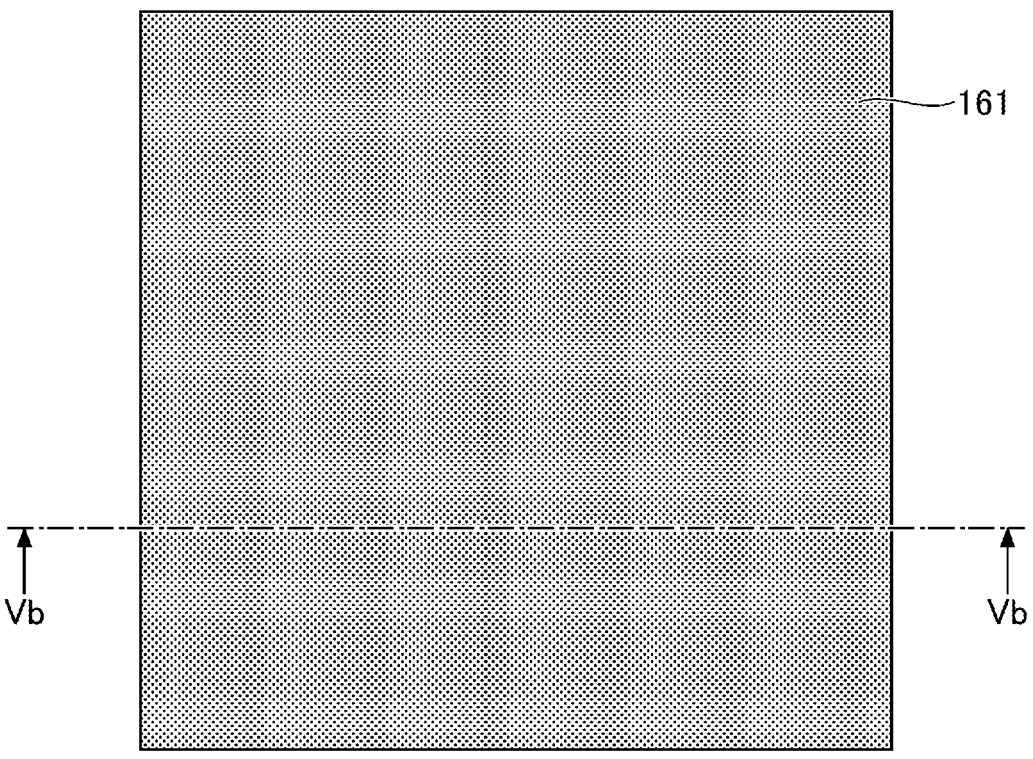
FIGS. 5A and 5B are drawings illustrating the method of making the lead frame according to the first embodiment.
Figure 5B:
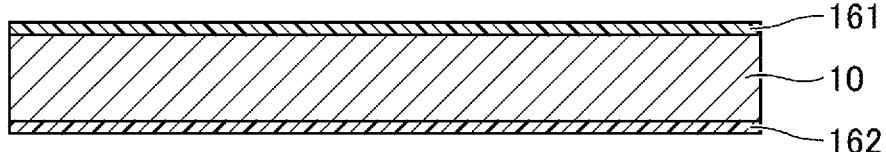

As illustrated in FIGS. 4A and 5B, a metal plate 10 having a predetermined shape is provided. The metal plate 10 is a member that is finally cut along cutting lines to be separated into the discrete separation areas 101. As the material of the metal plate 10, for example, Cu, a Cu alloy, a 42 alloy, or the like may be used. The metal plate 10 may be about 100 μm to 300 μm in thickness, for example. FIG. 4B corresponds to a cross-sectional view taken along the line IVb-IVb in FIG. 4A.

As illustrated in FIGS. 5A and 5B, a photosensitive resist 161 is formed on the upper surface of the metal plate 10, and a photosensitive resist 162 is formed on the lower surface of the metal plate 10. The resists 161 and 162 may be formed by applying and then drying a resist solution, or may be formed by attaching resist films. As the resists 161 and 162, a dry film resist, an electrodeposited resist, or the like made of an epoxy resin, an acrylic resin, or the like, for example, may be used. FIG. 5B corresponds to a cross-sectional view taken along the line Vb-Vb in FIG. 5A.

Figure 6A:
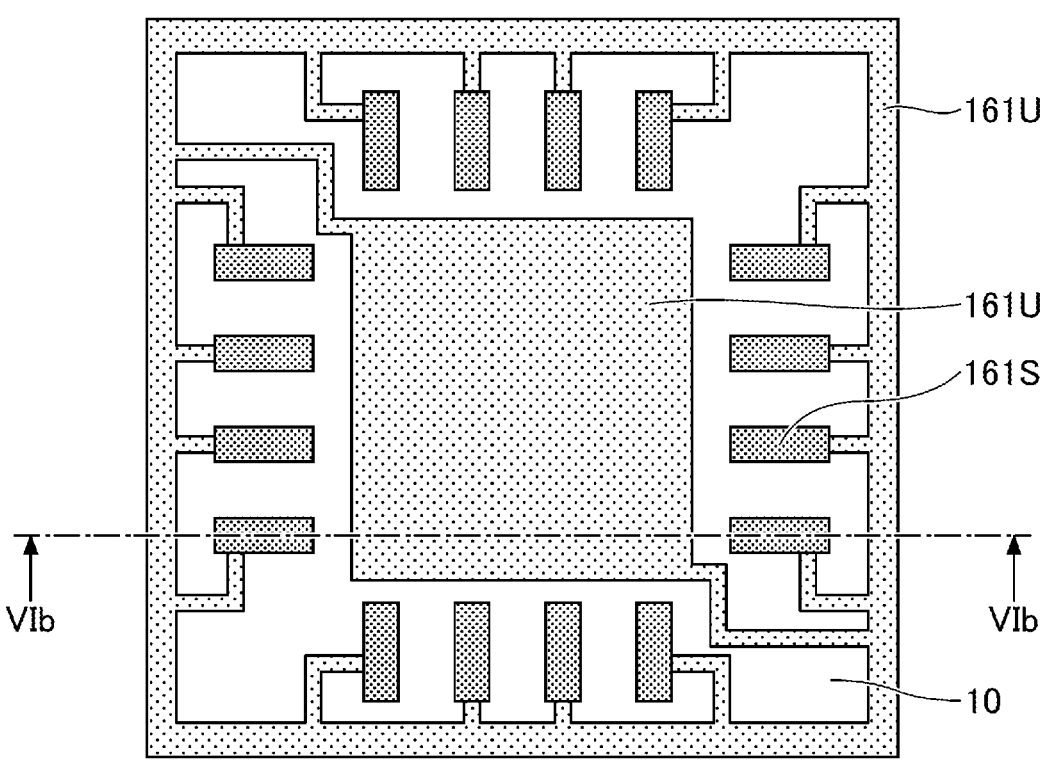
FIGS. 6A and 6B are drawings illustrating the method of making the lead frame according to the first embodiment.
Figure 6B:
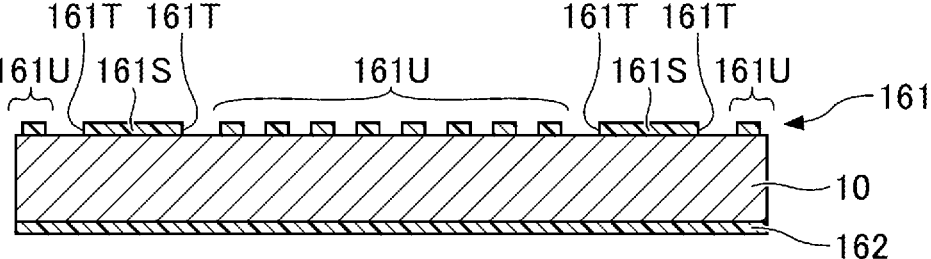
Figure 13:
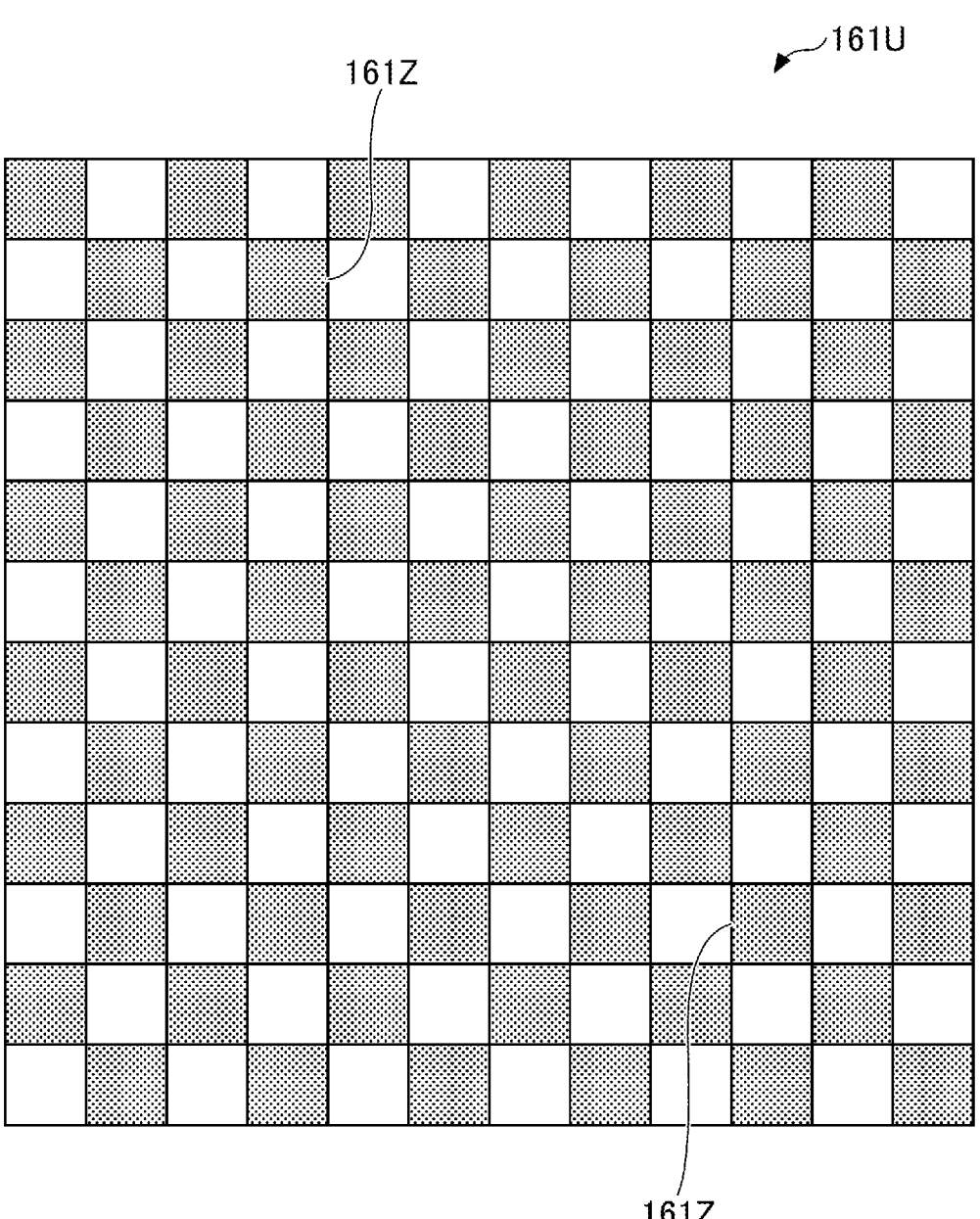
FIG. 13 is a top view illustrating an example of a dummy pattern.

As illustrated in FIGS. 6A and 6B, the resist 161 is exposed to light and developed, which forms covering patterns 161S, openings 161T, and a dummy pattern 1610 in the resist 161. The covering patterns 161S are the portions for forming the lead portions 12 in the metal plate 10. The openings 161T are the portions for forming the link portions 20 in the metal plate 10. The dummy pattern 1610 is the portion for forming the die pad portion 11, the outer frame 151, the section bars 152, and the plating lead portions 153 in the metal plate 10. As illustrated in FIG. 13, the dummy pattern 1610 includes a plurality of openings 161Z that is smaller than the openings 161T. The openings 161Z are arranged in a checkered pattern, for example. FIG. 13 is a top view illustrating an example of the dummy pattern 1610. FIG. 6B corresponds to a cross-sectional view taken along the line VIb-VIb in FIG. 6A. The dummy pattern 161U illustrated in FIG. 13 is merely an example, and the arrangement of the openings 1612 is not limited to a checkered pattern.

Figure 7A:
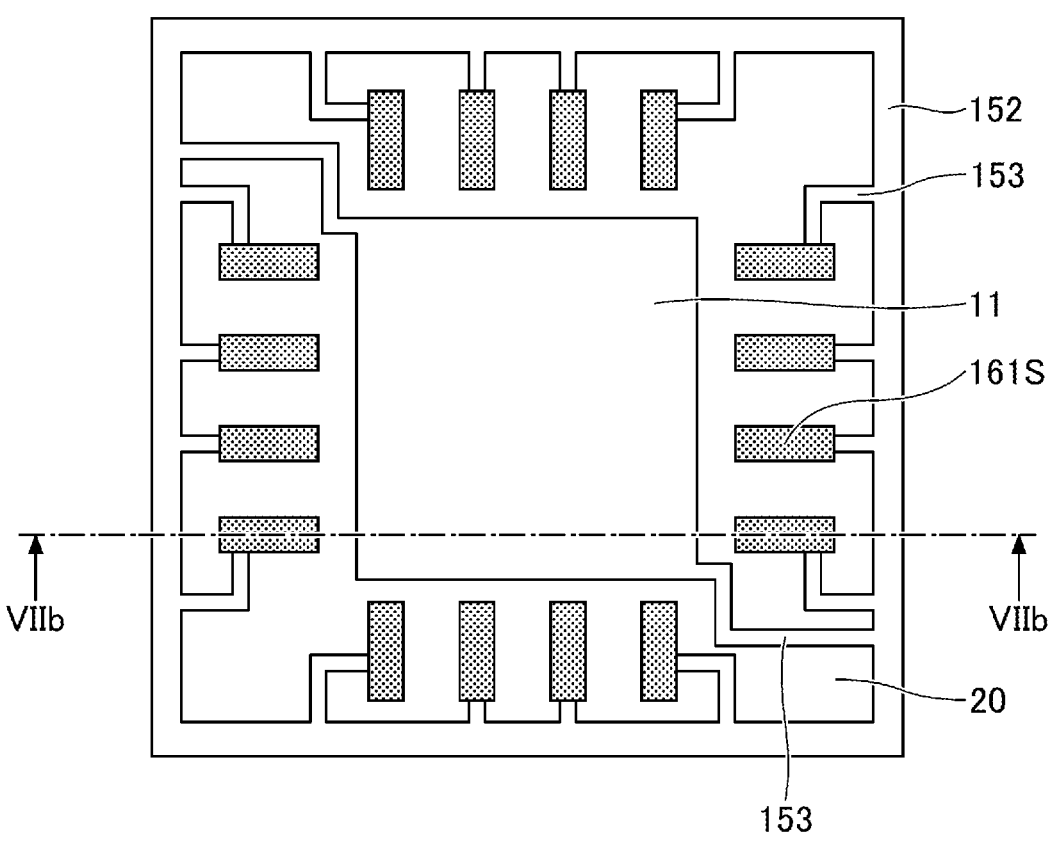
FIGS. 7A and 7B are drawings illustrating the method of making the lead frame according to the first embodiment.
Figure 7B:
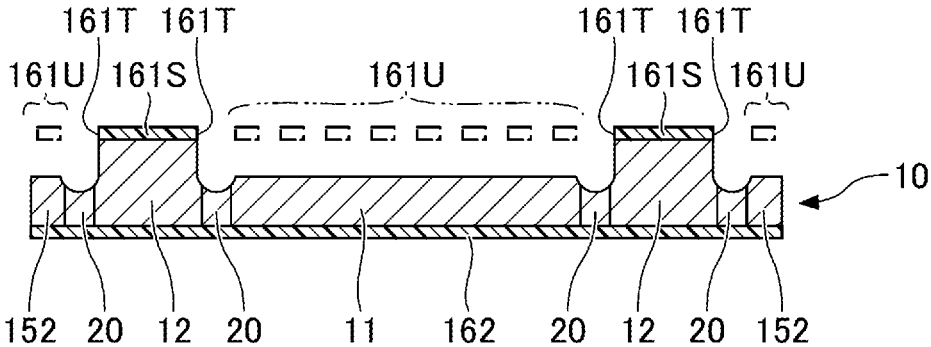

As illustrated in FIGS. 7A and 7B, half etching (for example, wet etching) of the metal plate 10 is performed from the upper surface side of the metal plate 10 using the resists 161 and 162 as etching masks. When the metal plate 10 is made of copper, for example, an aqueous solution of ferric chloride or cupric chloride can be used for half-etching of the metal plate 10. In the half etching, since the openings 161T are larger than the openings 1612, the metal plate 10 is etched more rapidly under the openings 161T than under the openings 161Z. As the etching proceeds, the dummy pattern 1610 is separated from the metal plate 10. As a result of the half-etching, the metal plate 10 is etched more deeply under the openings 161T than under the dummy pattern 161U. FIG. 7B corresponds to a cross-sectional view taken along the line VIIb-VIIb in FIG. 7A.

Through the above-described processes, the die pad portion 11, the lead portions 12, the outer frame 151, the section bars 152, the plating lead portions 153, and the link portions 20 are formed in the metal plate 10.

Figure 8A:
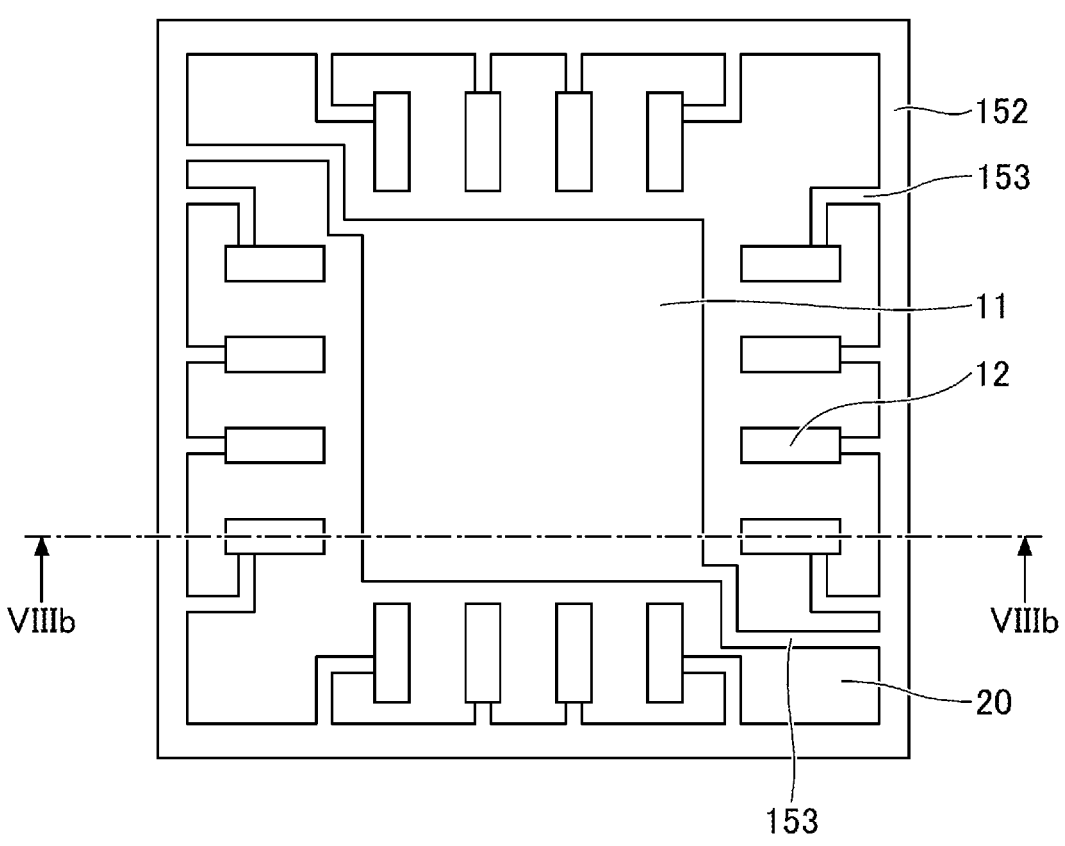
FIGS. 8A and 8B are drawings illustrating the method of making the lead frame according to the first embodiment.
Figure 8B:
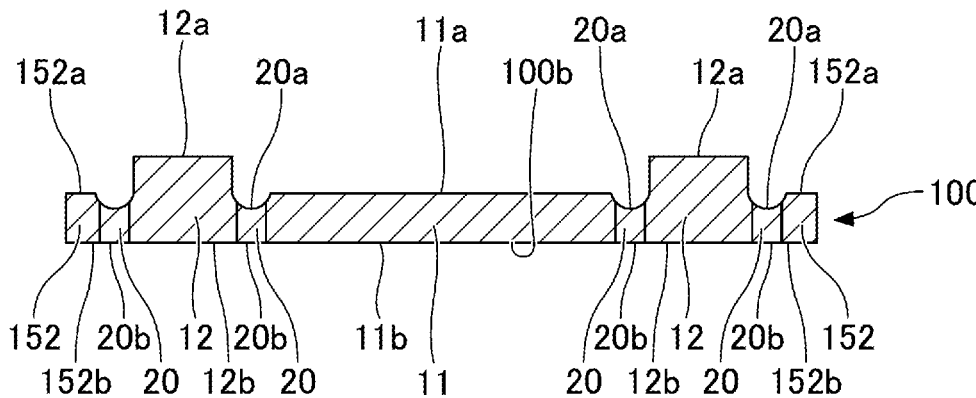

As illustrated in FIGS. 8A and 8B, the resists 161 and 162 are removed. The resists 161 and 162 may be removed with, for example, a stripping solution. With this process, the lead frame 100 is completed in final form. The lead frame 100 has the lower surface 100b. The lower surface 100b includes the lower surface 11b of the die pad portion 11, the lower surfaces 12b of the lead portions 12, the lower surfaces 152b of the section bars 152, the lower surfaces 153b of the plating lead portions 153, and the lower surfaces 20b of the link portions 20. FIG. 8B corresponds to a cross-sectional view taken along the line VIIIb-VIIIb in FIG. 8A.

Figure 9A:
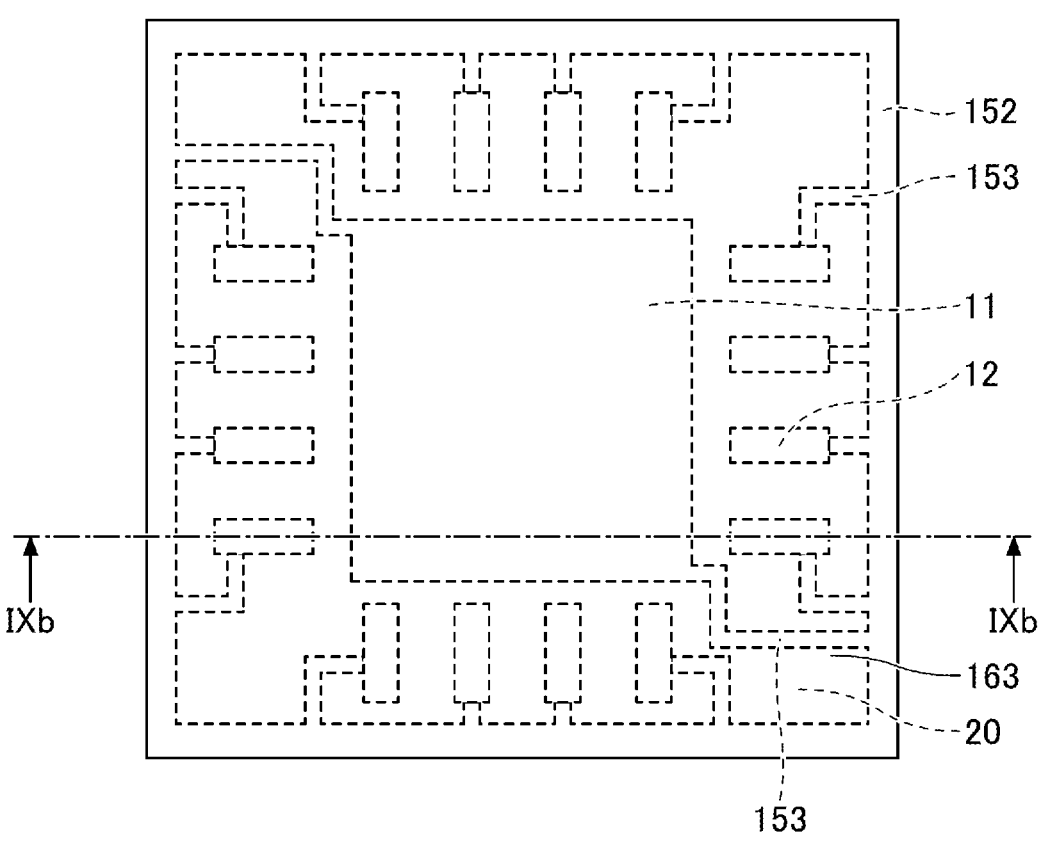
FIGS. 9A and 9B are drawings illustrating the method of making the lead frame according to the first embodiment.
Figure 9B:
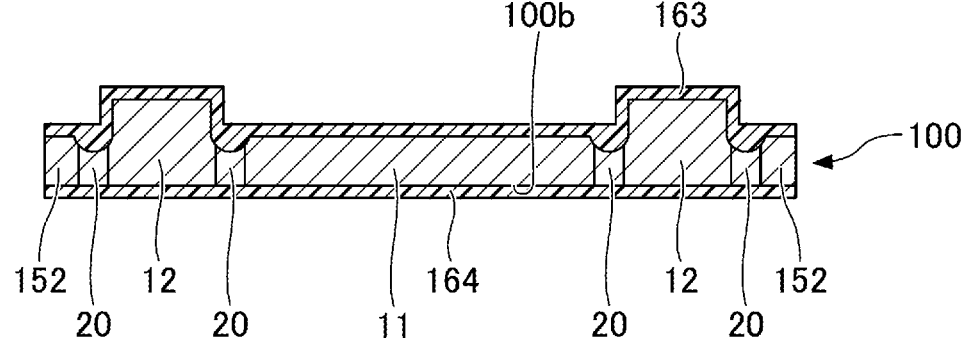

Subsequently, the plating layer 31 may optionally be formed on the lead frame 100. In order to form the plating layer 31, a photosensitive resist 163 is formed on the upper surface of the metal plate 10, and a photosensitive resist 164 is formed on the lower surface of the metal plate 10 as illustrated in FIGS. 9A and 9B. The resist 163 is formed by applying and then drying a resist solution, for example. This can cope with the upper surface irregularities of the metal plate 10. The resist 164 may be formed by applying and then drying a resist solution, or by attaching a resist film. As the resist 163, an electrodeposited resist made of an epoxy resin, an acrylic resin, or the like, for example, may be used. As the resist 164, a dry film resist, an electrodeposited resist, or the like made of an epoxy resin, an acrylic resin, or the like, for example, may be used. FIG. 9B corresponds to a cross-sectional view taken along the line IXb-IXb in FIG. 9A.

Figure 10A:
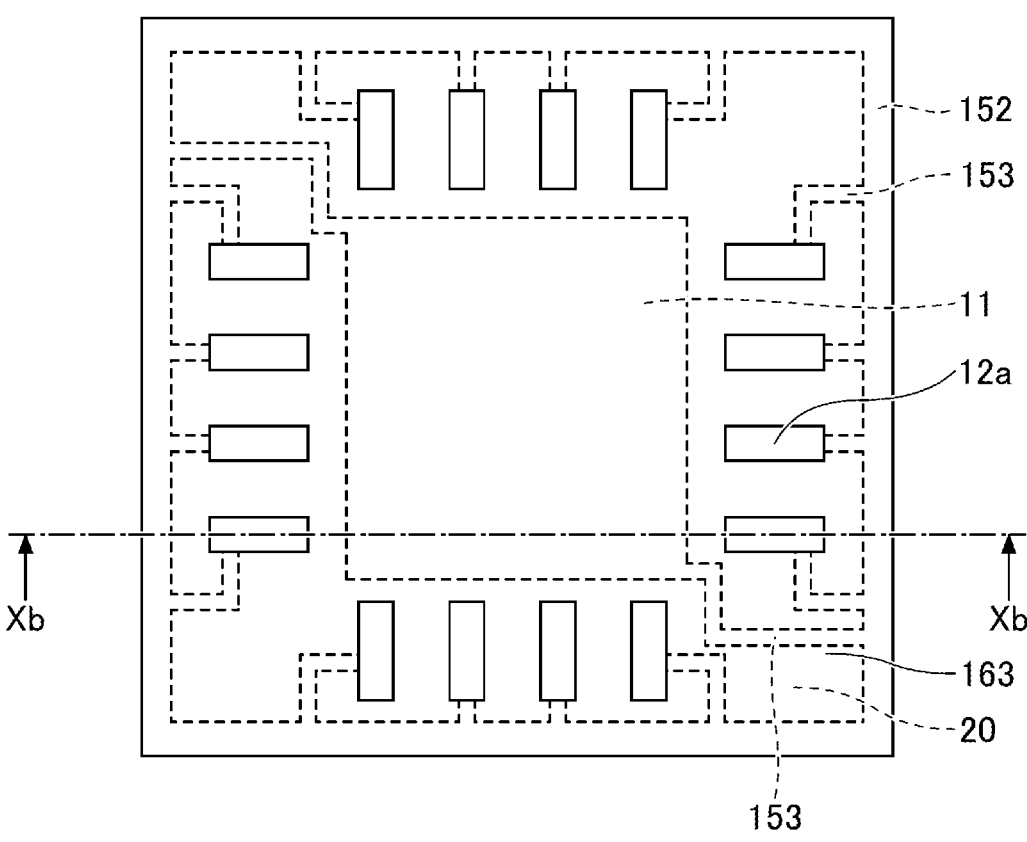
FIGS. 10A and 10B are drawings illustrating the method of making the lead frame according to the first embodiment.
Figure 10B:
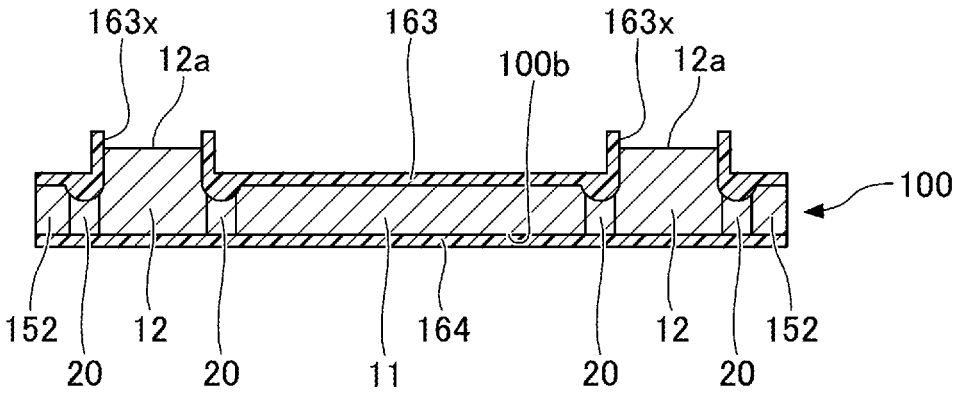

As illustrated in FIGS. 10A and 10B, the resist 163 is exposed to light and developed to form openings 163X in the resist 163. The openings 163X are for forming the plating layer 31, and the upper surfaces 12a of the lead portions 12 are exposed in the openings 163X. FIG. 10B corresponds to a cross-sectional view taken along the line Xb-Xb in FIG. 10A.

Figure 11A:
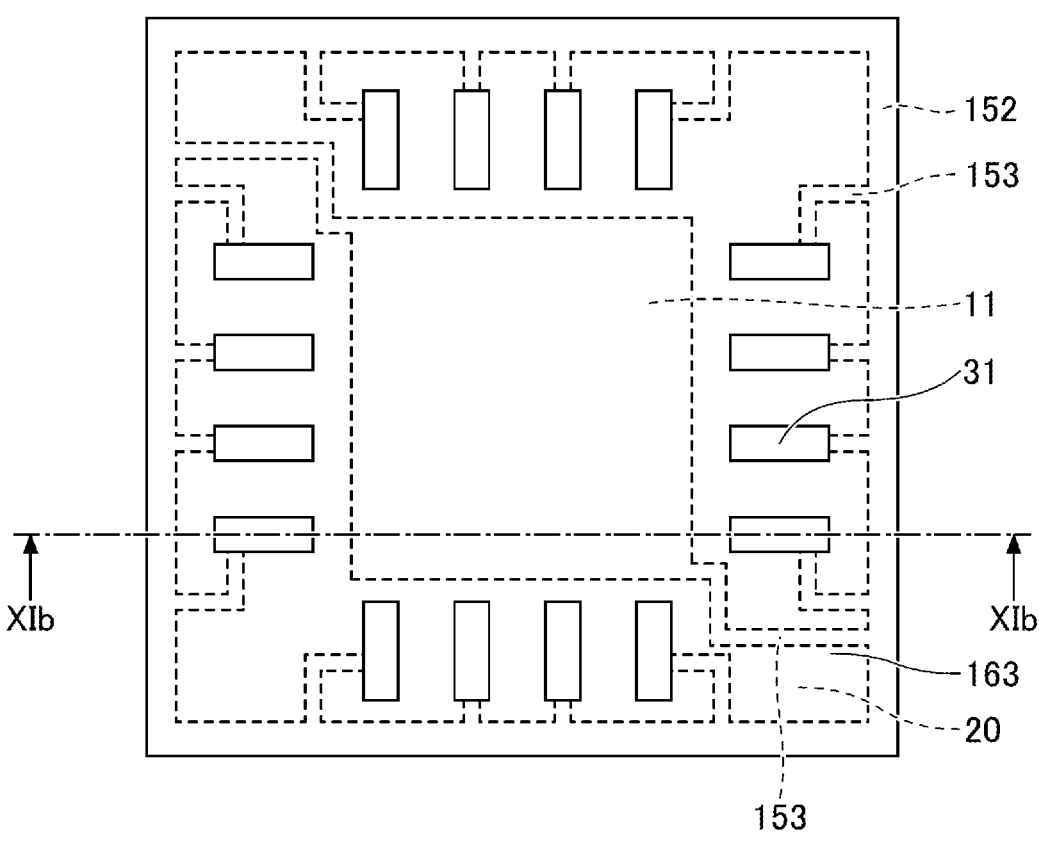
FIGS. 11A and 11B are drawings illustrating the method of making the lead frame according to the first embodiment.
Figure 11B:
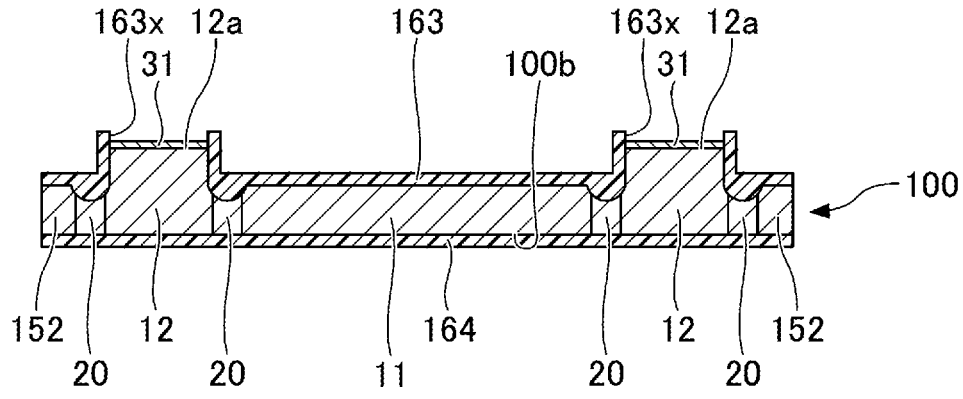

As illustrated in FIGS. 11A and 11B, the plating layer 31 is formed on the upper surfaces 12a of the lead portions 12 exposed in the openings 163X. The plating layer 31 may be formed by, for example, an electrolytic plating method using the metal plate 10 as a power feeding path. FIG. 11B corresponds to a cross-sectional view taken along the line XIb-XIb in FIG. 11A.

Figure 12A:
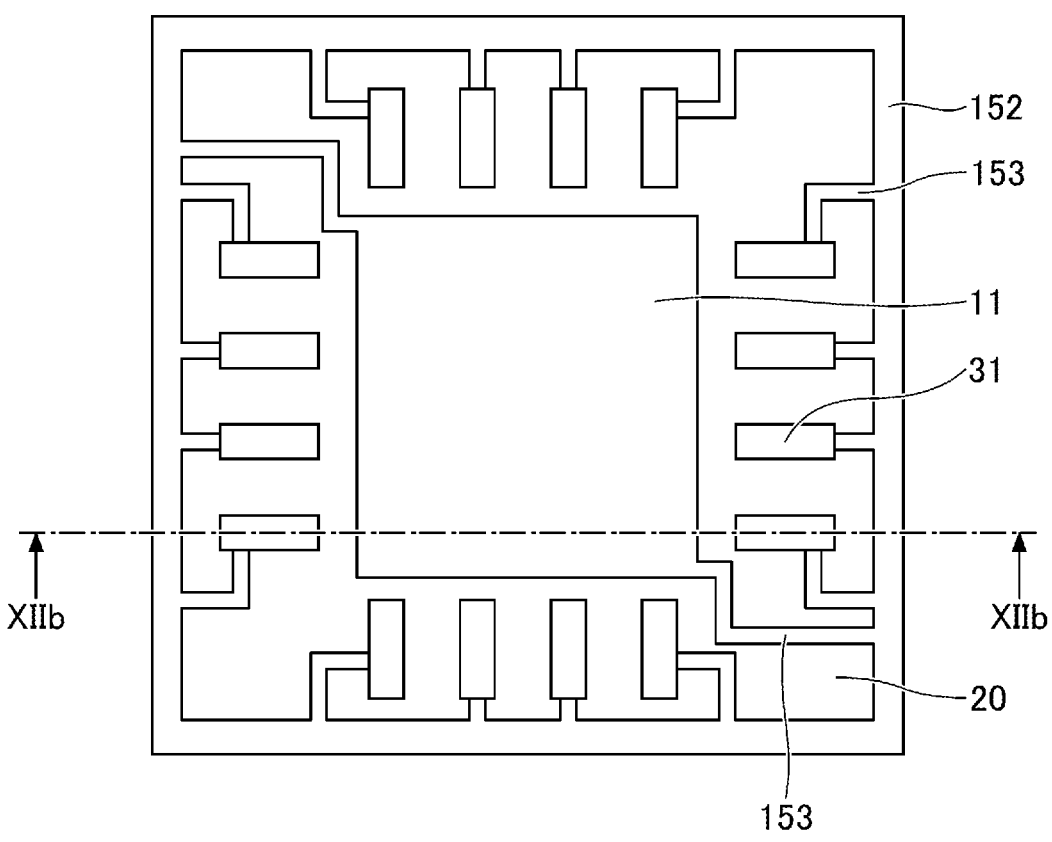
FIGS. 12A and 12B are drawings illustrating the method of making the lead frame according to the first embodiment.
Figure 12B:
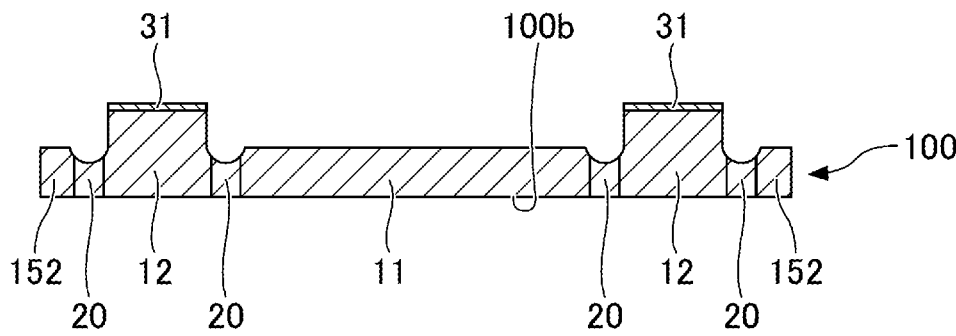

As illustrated in FIGS. 12A and 12B, the resists 163 and 164 are removed. The resists 163 and 164 may be removed with, for example, a stripping solution. FIG. 12B corresponds to a cross-sectional view taken along the line XIIb-XIIb in FIG. 12A.

Through the above-described processes, the lead frame 100 having the plating layer 31 is completed in final form.

[Method of Making Semiconductor Apparatus]

In the following, a method of making a semiconductor apparatus using the lead frame 100 according to the first embodiment will be described. FIGS. 14A to 14C through FIGS. 16A and 16B are cross-sectional views illustrating the method of making a semiconductor apparatus using the lead frame 100 according to the first embodiment.

Figure 14A:
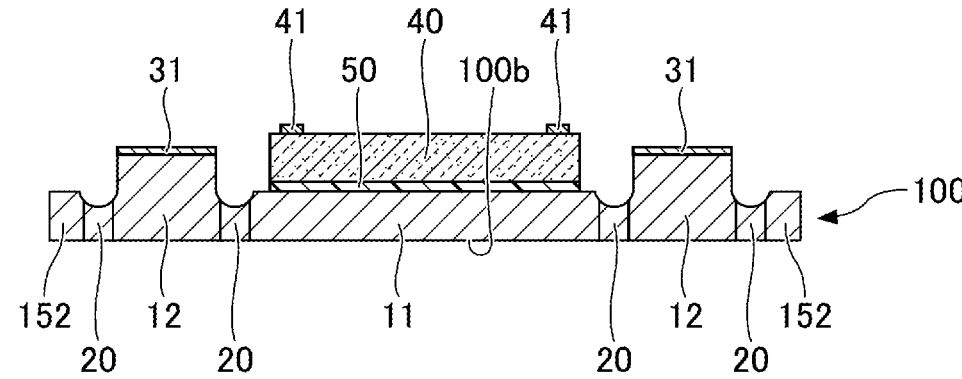
FIGS. 14A through 14C are cross-sectional views illustrating a method of making a semiconductor apparatus using the lead frame according to the first embodiment.

As illustrated in FIG. 14A, the lead frame 100 according to the first embodiment is provided, and a semiconductor device 40 is mounted on the upper surface 11a of the die pad portion 11. The semiconductor device 40 has electrodes 41 on the upper surface thereof. The upper surface 11a of the die pad portion 11 and the lower surface of the semiconductor device 40 are bonded to each other with an adhesive 50. As the adhesive 50, a die attach film, an Ag paste, or the like is used.

Figure 14B:
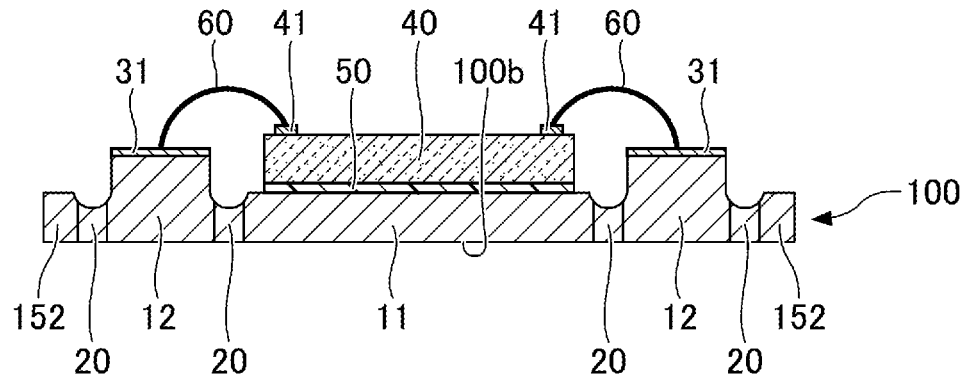

As illustrated in FIG. 14B, the plating 31 and the electrodes 41 are electrically layer connected through bonding wires 60.

Figure 14C:
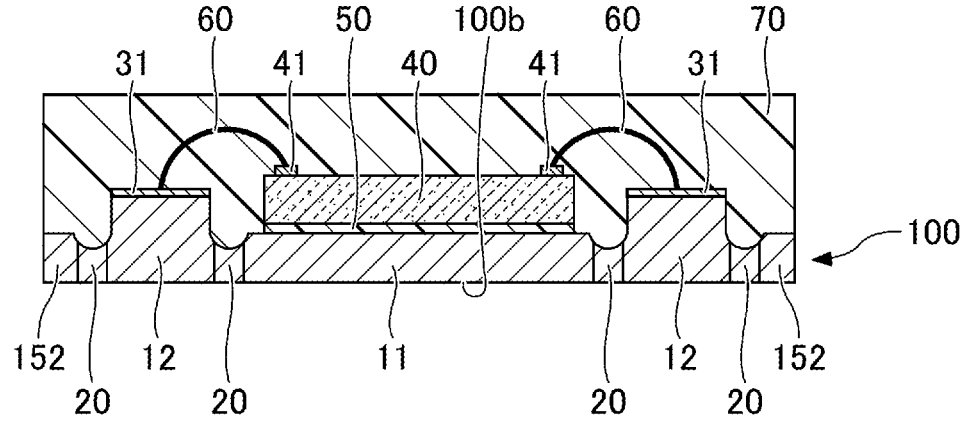

As illustrated in FIG. 14C, the semiconductor device 40 and the bonding wires 60 are encapsulated in an encapsulation resin 70. The upper surface of the lead frame 100 is also encapsulated with the encapsulation resin 70. The lower surface 100b of the lead frame 100 is exposed outside the encapsulation resin 70. As the encapsulation resin 70, a mold resin or the like made by combining an epoxy resin with a filler may be used, for example. The encapsulation resin 70 may be formed by, for example, a transfer molding method or a compression molding method.

Figure 15A:
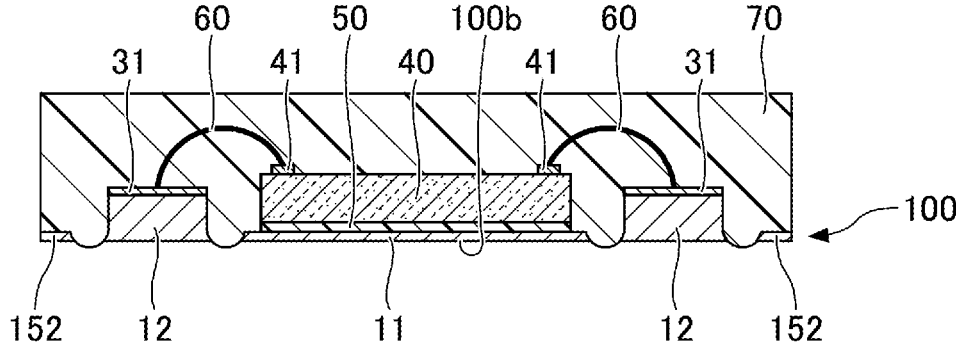
FIGS. 15A through 15C are cross-sectional views illustrating the method of making a semiconductor apparatus using the lead frame according to the first embodiment.

As illustrated in FIG. 15A, the lead frame 100 is etched back from the side where the lower surface 100b is situated, thereby removing the link portions 20. As a result, direct connections between the die pad portion 11 and the lead portions 12 are removed. The lead portions 12 are electrically connected to the section bars 152 via the plating lead portions 153 directly connected to the lead portions 12, but the plurality of lead portions 12 are electrically connected to each other only via the section bars 152. The die pad portion 11 is electrically connected to the section bars 152 via the plating lead portions 153 directly connected to the die pad portion 11, but is electrically connected to each of the lead portions 12 only via the section bars 152. In addition, the lead frame 100 becomes thinner, and the lower surface 100b of the lead frame 100 moves toward the upper surface side.

As a result, part of the encapsulation resin 70 protrudes below the lower surface 100b of the lead frame 100. As the etch-back of the lead frame 100, wet etching may be performed, for example.

Figure 15B:
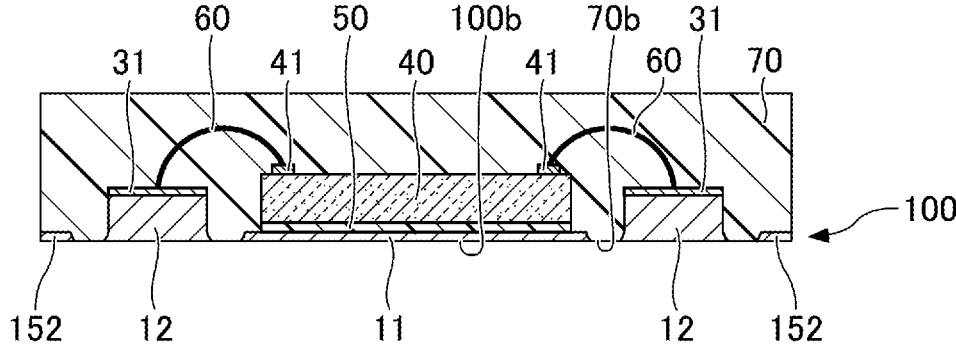

As illustrated in FIG. 15B, the portion of the encapsulation resin 70 protruding below the lower surface 100b of the lead frame 100 is removed so that the lower surface 70b of the encapsulation resin 70 is flush with the lower surface 100b of the lead frame 100. The removal of the encapsulation resin 70 may be performed by grinding or sandblasting, for example.

Figure 15C:
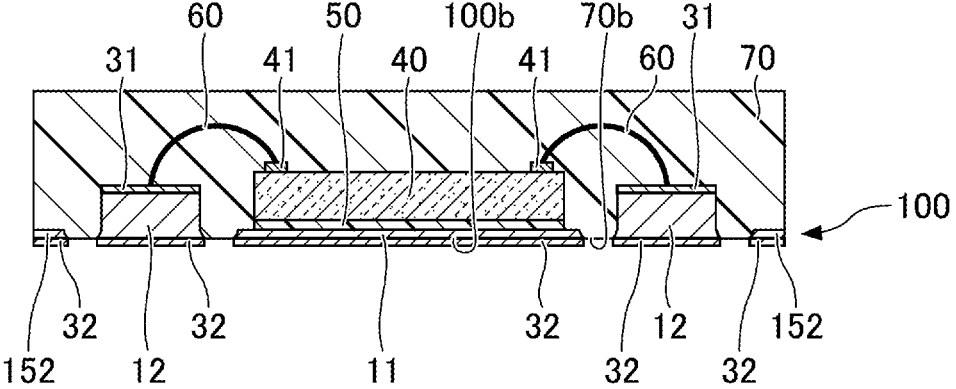

As illustrated in FIG. 15C, a plating layer 32 is formed on the lower surface 11b of the die pad portion 11, the lower surfaces 12b of the lead portions 12, the lower surfaces 152b of the section bars 152, and the lower surfaces 153b of the plating lead portions 153 (see FIG. 3B). The plating layer 32 may be formed by, for example, an electrolytic plating method using the section bars 152 and the plating lead portions 153 as a power feeding path. As the plating layer 32, a solder plating layer or a tin plating layer may be formed, for example.

Figure 16A:
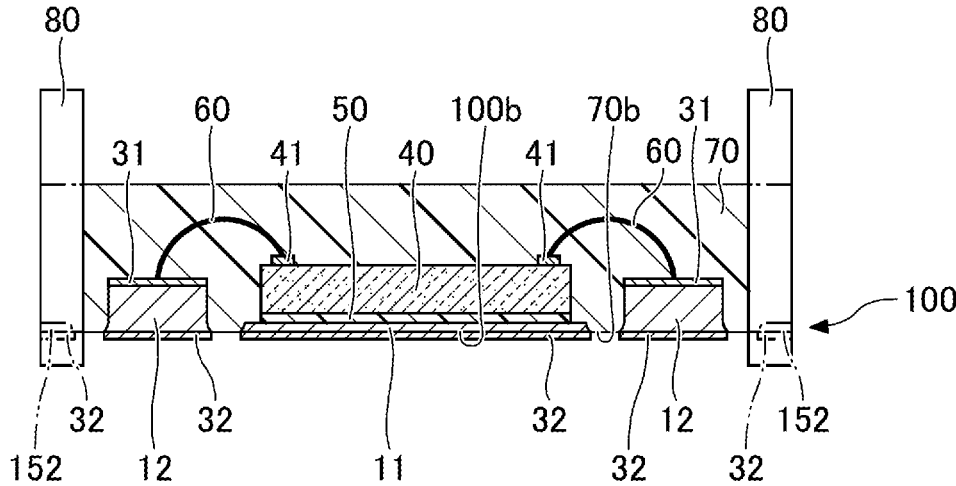
FIGS. 16A and 16B are cross-sectional views illustrating the method of making a semiconductor apparatus using the lead frame according to the first embodiment.

As illustrated in FIG. 16A, regions between adjacent discrete separation areas 101 are removed by cutting or the like using a slicer rotary blade 80, for example. As a result, the section bars 152 are removed. As the section bars 152 are removed, the plurality of lead portions 12 are electrically insulated from each other, and the die pad portion 11 is electrically insulated from each of the lead portions 12.

In this manner, the semiconductor apparatus 110 is completed in final form.

Figure 16B:
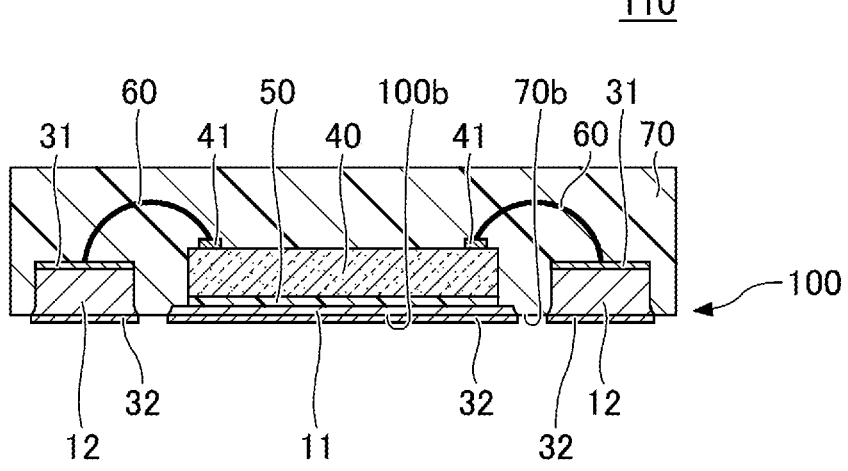

As illustrated in FIG. 16B, the semiconductor apparatus 110 includes the die pad portion 11, the lead portions 12, the semiconductor device 40 including the electrodes 41, the bonding wires 60, and the encapsulation resin 70. The semiconductor device 40 is mounted on the die pad portion 11. The bonding wires 60 connect the lead portions 12 and the electrodes 41. The encapsulation resin 70 encapsulates the semiconductor device 40 and the bonding wires 60. The encapsulation resin 70 has the lower surface 70b that is flush with the lower surface 100b of the lead frame 100. The side surface of the die pad portion 11 and the side surfaces of the lead portions 12 each include a portion inclined from a plane perpendicular to the lower surface 100b of the lead frame 100 such that the distance between the die pad portion 11 and each of the lead portions 12 decreases toward the lower surface 100b. The upper surface and side surface of both the die pad portion 11 and the lead portions 12 are covered with the encapsulation resin 70.

In the present embodiment, mounting of the semiconductor device and 40 forming of the encapsulation resin 70 may be performed while the lead frame 100 has the link portions 20. This enables the reduction of deformation of the lead frame 100 when mounting the semiconductor device 40 and forming the encapsulation resin 70. Further, the lead frame 100 is etched back from the lower surface 100b side after the mounting of the semiconductor device 40 and the forming of the encapsulation resin 70, which removes the link portions 20, and electrically insulates the die pad portion 11 and the lead portions 12 from each other. This etching back also serves to make the semiconductor apparatus 110 thinner.

Instead of etching back the lead frame 100, the link portions 20 may be removed by grinding the lead frame 100 from the lower surface 100b side. In this case, part of the encapsulation resin 70 is also ground when the lead frame 100 is ground, so that the lower surface 70b of the encapsulation resin 70 becomes flush with the lower surface 100b of the lead frame 100.

In order to adjust the thickness of the die pad portion 11, the die pad portion 11 may be half-etched.

Second Embodiment

In the following, a second embodiment will be described. The second embodiment differs from the first embodiment mainly in the configuration of section bars.

[Structure of Lead Frame]

Figure 17:
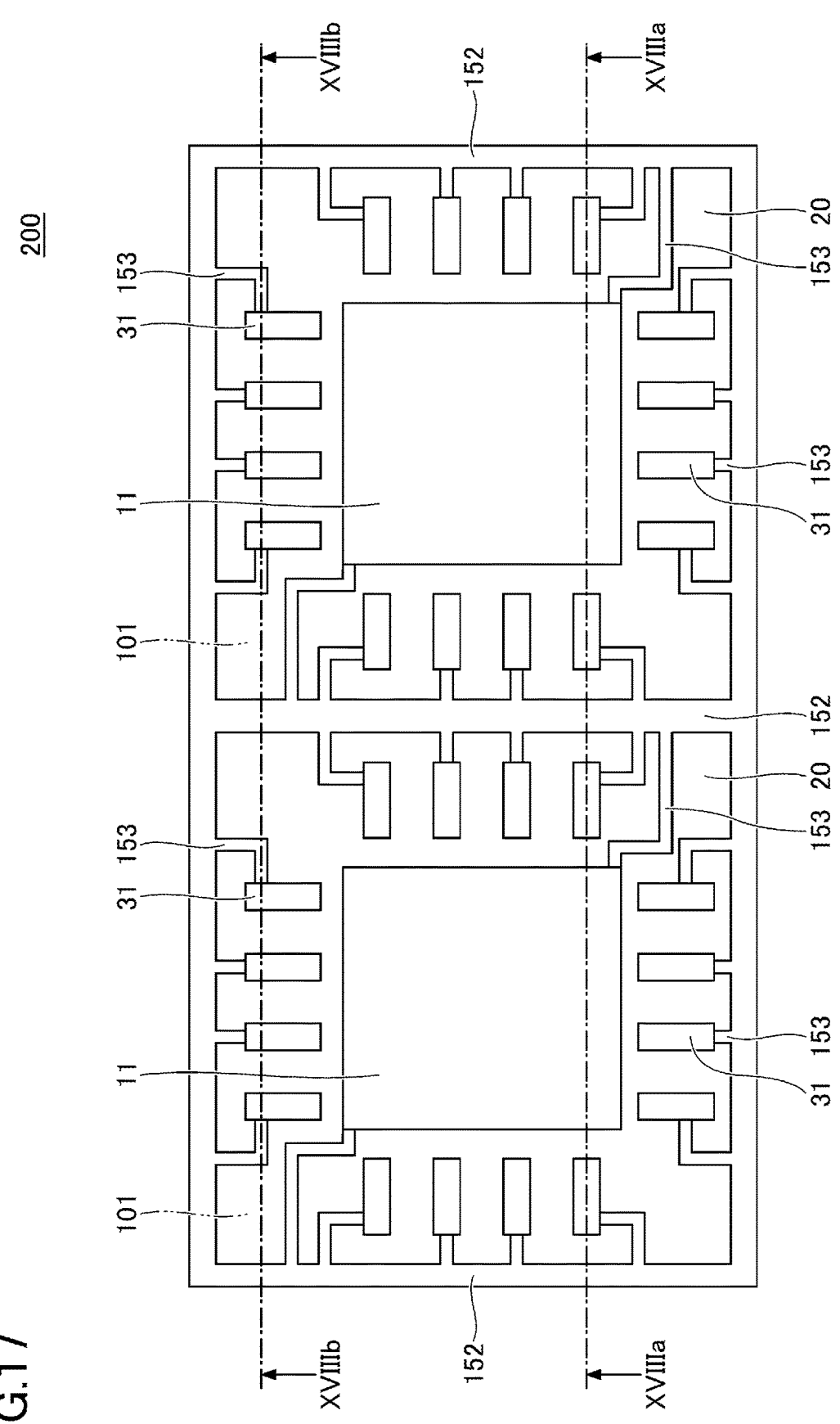
FIG. 17 is an enlarged top view illustrating part of a lead frame according to a second embodiment.
Figures 18A, 18B:
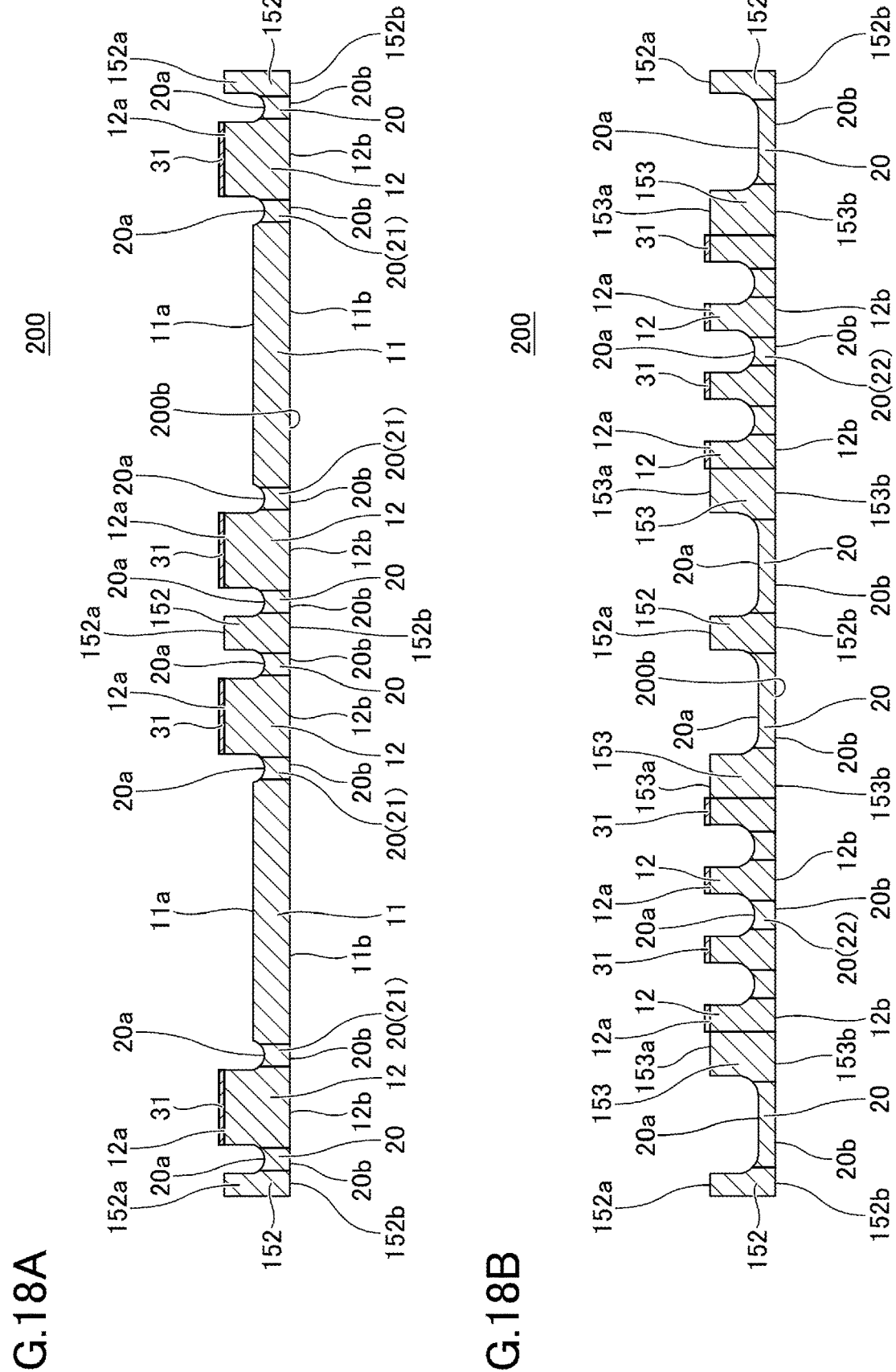
FIGS. 18A and 18B are cross-sectional views illustrating the lead frame according to the second embodiment.

The structure of the lead frame according to the second embodiment will be described. FIG. 17 is an enlarged top view illustrating part of the lead frame according to the second embodiment. FIGS. 18A and 18B are cross-sectional views illustrating the lead frame according to the second embodiment. FIG. 18A corresponds to a cross-sectional view taken along the line XVIIIa-XVIIIa in FIG. 17. FIG. 18B corresponds to a cross-sectional view taken along line XVIIIb-XVIIIb in FIG. 17.

In a lead frame 200 according to the second embodiment, the upper surfaces 152a of the section bars 152 and the upper surfaces 153a of the plating lead portions 153 are flush with the upper surfaces 12a of the lead portions 12.

The lower surface 11b of the die pad portion 11, the lower surfaces 12b of the lead portions 12, the lower surfaces 152b of the section bars 152, the lower surfaces 153b of the plating lead portions 153, and the lower surfaces 20b of the link portions 20 constitute the lower surface 200b of the lead frame 200.

The remaining configurations are the same as those of the first embodiment.

[Method of Making Lead Frame]

Figure 19A:
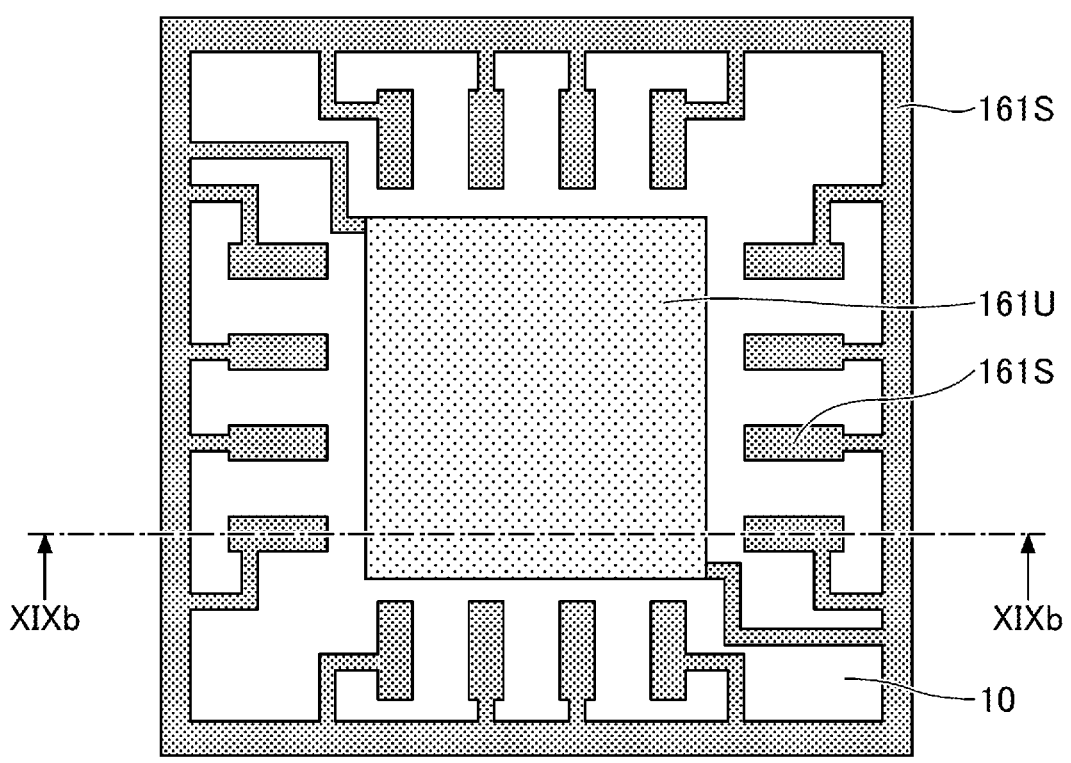
FIGS. 19A and 19B are drawings illustrating a method of making the lead frame according to the second embodiment.
Figure 19B:
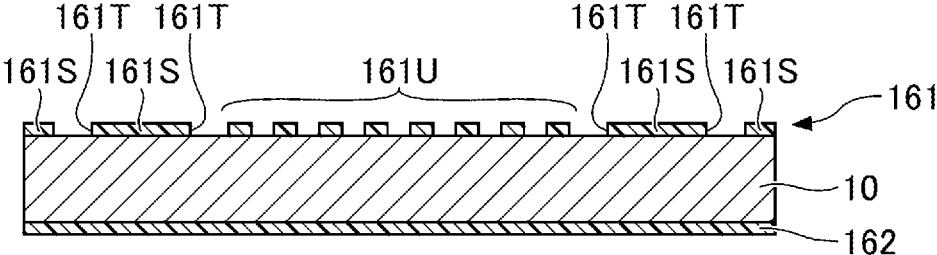
Figure 20A:
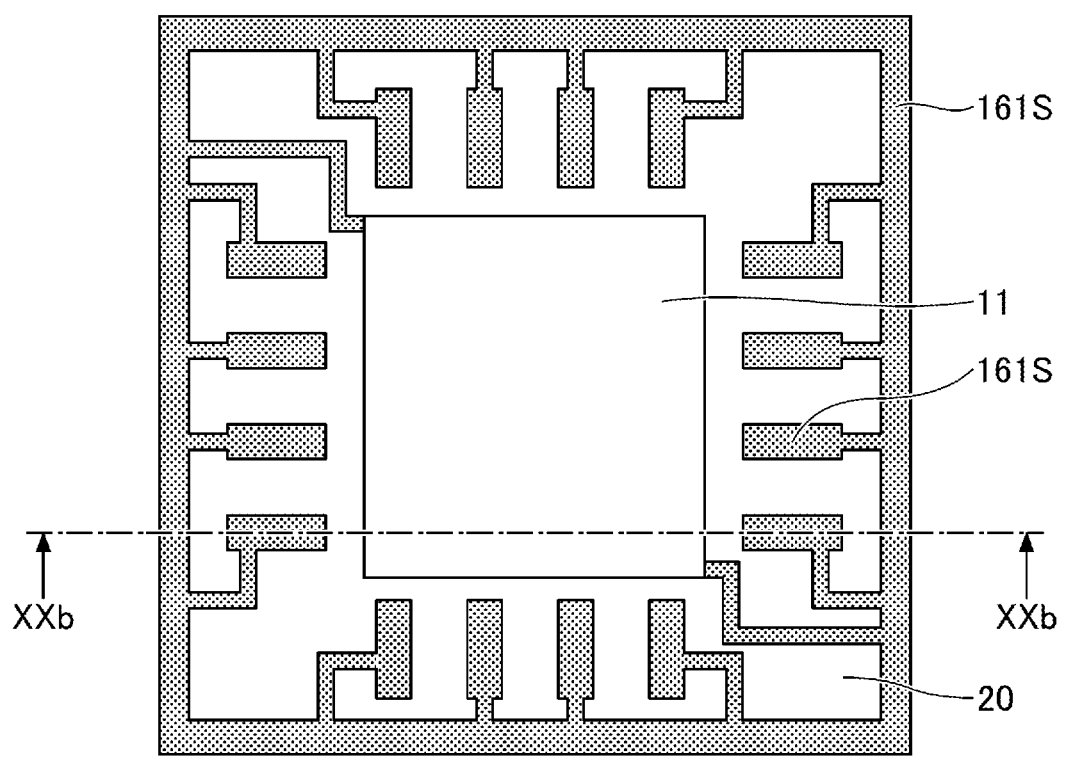
FIGS. 20A and 20B are drawings illustrating the method of making the lead frame according to the second embodiment.
Figure 20B:
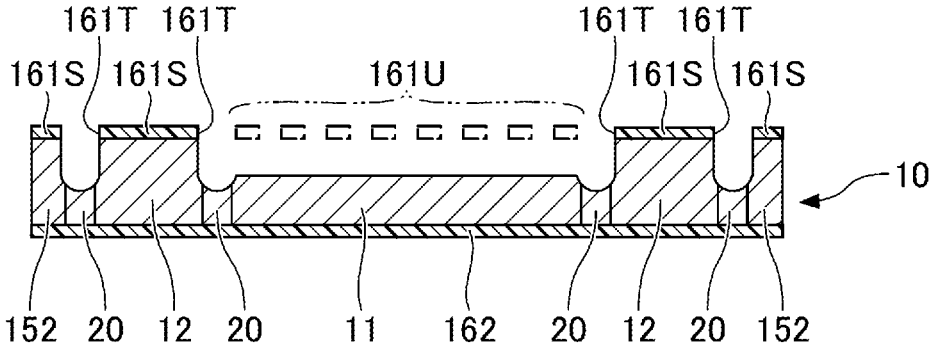

In the following, a method of making the lead frame 200 according to the second embodiment will be described. FIGS. 19A, 19B, 20A, and 20B are drawings illustrating the method of making the lead frame according to the second embodiment. FIGS. 19A and 20A are top views, and FIGS. 19B and 20B are cross-sectional views. FIGS. 19A, 19B, 20A, and 20B illustrate one of the discrete separation areas 101.

First, the processes up to the formation of the resists 161 and 162 are performed in substantially the same manner as in the first embodiment (see FIGS. 4A, 4B, 5A, and 5B). Then, as illustrated in FIGS. 19A and 19B, the resist 161 is exposed to light and developed to form a covering pattern 161S, openings 161T, and a dummy pattern 161U in the resist 161. The covering pattern 161S is a portion for forming the lead portions 12, the outer frame 151, the section bars 152, and the plating lead portions 153 in the metal plate 10. The openings 161T are portions for forming the link portions 20 in the metal plate 10. The dummy pattern 161U is a pattern for forming the die pad portion 11 in the metal plate 10. FIG. 19B corresponds to a cross-sectional view taken along the line XIXb-XIXb in FIG. 19A.

As illustrated in FIGS. 20A and 20B, half etching (for example, wet etching) of the metal plate 10 is performed from the upper surface side of metal plate 10 using the resists 161 and 162 as etching masks. The half-etching may be performed in substantially the same manner as in the first embodiment. As a result of the half-etching, the metal plate 10 is removed more deeply under the openings 161T than under the dummy pattern 161U. FIG. 20B corresponds to a cross-sectional view taken along the line XXb-XXb in FIG. 20A.

Through the processes described above, the die pad portion 11, the lead portions 12, the outer frame 151, the section bars 152, the plating lead portions 153, and the link portions 20 are formed in the metal plate 10.

Subsequently, the removal of the resists 161 and 162 and the subsequent processes are performed in substantially the same manner as in the first embodiment (see FIGS. 8A and 8B through FIGS. 12A and 12B).

Through the processes described above, the lead frame 200 is completed in final form.

According to the second embodiment, the same effect as that of the first embodiment is advantageously obtained. That is, the method of making the semiconductor apparatus enables the reduction of deformation of the lead frame 200 when mounting the semiconductor device 40 and forming the encapsulation resin 70. Further, the die pad portion 11 and the lead portions 12 are electrically insulated from each other by etching back the lead frame 200 from the lower surface 200*b* side after the mounting of the semiconductor device 40 and the forming of the encapsulation resin 70. Moreover, the etching back serves to make the semiconductor apparatus 110 thinner.

According to at least one embodiment, it is possible to reduce the thickness of a semiconductor apparatus while reducing deformation of a lead frame.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

The present disclosures non-exhaustively include the subject matter set out in the following clauses.

Clause 1. A method of making a lead frame, comprising:
providing a first resist on a first side of a metal plate and a second resist on a second side of the metal plate;
patterning the first resist to form a covering pattern, an opening, and a dummy pattern in the first resist; and
half-etching the metal plate from the first side through the first resist to form a die pad portion in the metal plate on a same side of the dummy pattern as the second side, a lead portion in the metal plate on a same side of the covering pattern as the second side, and a link portion on a same side of the opening as the second side,
wherein the die pad portion has a first surface and a second surface opposite to the first surface,
wherein the lead portion has both a third surface flush with the first surface and a fourth surface opposite to the third surface,
wherein the link portion connects the die pad portion and the lead portion together, and
wherein the link portion includes a first portion that surrounds the die pad portion between the die pad portion and the lead portion in a plan view,
wherein the first portion has a fifth surface flush with both the first surface and the third surface, and has a sixth surface opposite to the fifth surface,
wherein the second surface is closer to a plane containing the first surface, the third surface, and the fifth surface than is the fourth surface, and
wherein the sixth surface is closer to the plane containing the first surface, the third surface, and the fifth surface than is the second surface.

Clause 2. The method according to clause 1, wherein the patterning and the half-etching form a plurality of said lead portions,
wherein the link portion includes a second portion situated between two lead portions, among the plurality of said lead portions, adjacent to each other in the plan view,
wherein the second portion has a seventh surface flush with both the first surface and the third surface, and has an eighth surface opposite to the seventh surface, and
wherein the eighth surface is closer to the plane containing the first surface, the third surface, and the fifth surface than is the second surface.

Clause 3. The method according to clause 1 or 2, further comprising forming a plating layer on the fourth surface.

Clause 4. A method of making a semiconductor apparatus, comprising:
mounting a semiconductor device including an electrode on the die pad portion of the lead frame of any one of claims 1 to 3;
connecting the lead portion and the electrode through a bonding wire; and
encapsulating the semiconductor device and the bonding wire with an encapsulation resin such that the first surface, the third surface, and the fifth surface are exposed outside the encapsulation resin; and
removing the link portion.

Clause 5. The method according to clause 4, wherein the removing the link portion includes etching the lead frame from a same side as the first surface, the third surface, and the fifth surface.

Clause 6. The method according to clause 4 or 5, further comprising removing a portion of the encapsulation resin protruding from the first surface and the third surface after the removing the link portion.

Clause 7. The method according to clause 4, wherein the removing the link portion includes grinding the lead frame and the encapsulation resin from a same side as the first surface, the third surface, and the fifth surface.

Clause 8. The method according to any one of clauses 4 to 7, further comprising forming a second plating layer on the first surface and the third surface after the removing of the link portion.

What is claimed is:

1. A lead frame strip including a plurality of discrete separation areas for singulation, comprising:
a die pad portion having a first surface and a second surface opposite to the first surface;
a lead portion having both a third surface flush with the first surface and a fourth surface opposite to the third surface;
a link portion connecting the die pad portion and the lead portion together;
a section bar surrounding the die pad portion, the lead portion, and the link portion in a plan view; and
plating lead portions connecting the section bar to the lead portion and the die pad portion,
wherein the link portion includes a first portion that surrounds the die pad portion between the die pad portion and the lead portion in the plan view,
wherein the first portion has a fifth surface flush with both the first surface and the third surface, and has a sixth surface opposite to the fifth surface,
wherein the second surface is closer to a plane containing the first surface, the third surface, and the fifth surface than is the fourth surface, wherein the sixth surface is closer to the plane containing the first surface, the third surface, and the fifth surface than is the second surface, and wherein each point between the die pad portion and the section bar is occupied by the lead portion, the link portion, or one of the plating lead portions, and no vacant through hole exists in any area that is surrounded by the section bar in the plan view.

2. The lead frame according to claim 1, comprising a plurality of said lead portions, wherein the link portion includes a second portion situated between two lead portions, among the plurality of said lead portions, adjacent to each other in the plan view, wherein the second portion has a seventh surface flush with both the first surface and the third surface, and has an eighth surface opposite to the seventh surface, and wherein the eighth surface is closer to the plane containing the first surface, the third surface, and the fifth surface than is the second surface.

3. The lead frame according to claim 1, further comprising a plating layer disposed on the fourth surface.

\* \* \* \* \*